(12) United States Patent
Chan et al.

(10) Patent No.: US 7,289,004 B2
(45) Date of Patent: Oct. 30, 2007

(54) DUAL PORT MODULATOR

(75) Inventors: Evelyn L Chan, Selangor (MY); Fuad Haji Mokhtar, Kedah (MY); Ann Yen Lim, Penang (MY)

(73) Assignee: Motorola, Inc., Schaumburg, IL (US)

( * ) Notice: Subject to any disclaimer, the term of this patent is extended or adjusted under 35 U.S.C. 154(b) by 99 days.

(21) Appl. No.: 11/204,141

(22) Filed: Aug. 15, 2005

(65) Prior Publication Data

US 2007/0035354 A1    Feb. 15, 2007

(51) Int. Cl.
*H03C 3/09* (2006.01)
(52) U.S. Cl. .............. 332/128; 332/127; 332/136; 331/177 V
(58) Field of Classification Search ........... 332/128, 332/127, 136; 331/177 V
See application file for complete search history.

(56) References Cited

U.S. PATENT DOCUMENTS 5,075,644 A * 12/1991 Calvin ................ 332/136
5,557,244 A *  9/1996 Salvi ................... 332/128
5,894,592 A *  4/1999 Brueske et al. ........ 455/86
6,172,579 B1 * 1/2001 Dacus et al. ........... 332/128
7,157,985 B2 * 1/2007 Mitani et al. .......... 332/119

* cited by examiner

*Primary Examiner*—Robert Pascal
*Assistant Examiner*—Levi Gannon
(74) *Attorney, Agent, or Firm*—Terri S. Hughes

(57) ABSTRACT

The present invention relates generally to the field of frequency modulation, and in particular to dual port frequency modulators. The present invention provides a frequency modulator comprising a phase lock loop circuit (108) for receiving and modulating a carrier signal according to the low frequency component of a modulating signal, the phase lock loop circuit comprising a voltage controlled oscillator (118) for outputting a modulated carrier signal and a loop filter (116) for outputting a steering voltage to the VCO, the VCO having a tank circuit (120) comprising a voltage controlled capacitance (VAR1). The frequency modulator also comprises an external voltage controlled capacitance (122) which is arranged to modulate its capacitance according to a high frequency component of the modulating signal, the second voltage controlled capacitance being coupled to the tank circuit. The phase lock loop circuit (108) is further arranged to modulate the steering voltage to the VCO (118) with the high frequency component of the modulating signal.

3 Claims, 2 Drawing Sheets

DUAL PORT MODULATOR

FIELD OF THE INVENTION

The present invention relates generally to the field of frequency modulation, and in particular to dual port frequency modulators.

BACKGROUND OF THE INVENTION

Many digital radio communication systems, such as cellular, cordless and data transmission systems, use FSK, GFSK (Gaussian Frequency Shift Key), or GMSK (Gaussian Mean Shift Key) modulation techniques. These types of modulation techniques are in fact simply frequency modulation (FM) with the radio frequency (RF) signal envelope constant.

Since there is no amplitude modulation (AM) involved in these types of modulation techniques, the voltage controlled oscillator (VCO) frequency of the transmitters can be directly modulated by the baseband signal, as is typical in regular analog FM transmitters, such as in analog communications systems. Significant cost reductions can be obtained by directly modulating the VCO frequency. Such arrangements are particularly desirable in digital applications where low cost is a strategic factor. For example, the overall cost of a digital solution such as DECT must be very low to be competitive with well known analog systems such as CT0.

In order to avoid any inter symbol interferences which could corrupt the eyes pattern and degrade the bit error rate of the transmission in the digital system, the amplitude transfer function and the group delay on the modulation path has to be kept constant across the entire spectrum of the baseband signal. This requires the transfer function of the phase lock loop (PLL) to be high enough to pass the entire modulation spectrum. Furthermore, in order to meet the applicable radio specifications, the spectral purity of the RF signal source to be transmitted should be maintained as near to the carrier signal as possible for phase noise and modulation accuracy, and should be maintained as far from the carrier signal as possible to reduce harmonics, the noise floor, and discrete spurious signals. As a consequence, the transfer function of the PLL must be low enough to filter the noise.

A technique called Dual Port modulation is known to provide the capability to generate a low port modulation signal as well as a high port modulation. The low port modulation signal is typically used to drive a noise shaping circuit that controls the divider of the PLL, while at the same time the high port frequency modulation signal is used as a input to a high port path which utilizes a digital to analog converter (DAC) to directly drive the input voltage of a voltage controlled oscillator (VCO). The effect of the dual port modulation is to provide a low pass transfer function for the generated noise of the reference clock and the noise shaping circuitry, and to provide an all pass function to the input frequency deviation.

However due to practical manufacturing tolerances in components such as capacitors and inductors in these circuits, the modulation sensitivity response of the VCO across a range of transmission frequencies can be highly non-linear. The response is also affected by the method of coupling the high port signal to the VCO. The high port signal is typically coupled to the VCO at the loop filter such that it modulates the steering voltage to the VCO, or alternatively is used to modulate the capacitance of an external varactor which is coupled directly into the tank circuit of the VCO. The modulation sensitivity response for a simulated dual port frequency modulator having a high port signal coupled at the loop filter is shown in FIG. 1a. It can be seen that the modulation sensitivity of the VCO varies over a range of output frequencies. This is unacceptable for transmission devices and is typically addressed by "tuning" the circuit using variable gain or attenuation of the high port signal. By adjusting the gain of the high port signal, the modulation sensitivity can be flattened to an acceptable level prior to dispatch from the manufacturer.

The modulation sensitivity response of a simulated dual port frequency modulator having an external varactor modulated by the high port signal and coupled directly into the tank circuit of the VCO is shown in FIG. 1b. It can be seen that this also varies over a range of transmission frequencies and so this device arrangement also requires tuning using variable gain of the high port signal following manufacture.

The requirement for tuning adds to the time required to manufacture the frequency modulator units and hence their per unit cost. Also, as the modulation sensitivity can vary considerably over the transmission frequencies of interest, it may be necessary to significantly adjust the gain of the high port signal, requiring a large and expensive variable gain component in the modulator for this purpose.

SUMMARY OF THE INVENTION

In general terms in one aspect the present invention provides a dual port frequency modulator which couples the high port signal into the phase lock loop (PLL) circuit in such a way that the modulation sensitivity response of the VCO is flatter on average and prior to tuning, than the high port coupling approaches discussed above. This reduces the tuning time required to fully flatten the modulation response, and also the range requirement on the variable gain component for the high port signal, and hence its size and cost.

The pre-tuning response flattening is achieved by coupling the high port signal to modulate the steering voltage into the input of the VCO tank circuit, and additionally using the high port signal to vary an external variable capacitance coupled into the tank circuit. By combining these two methods of coupling the high port signal to the VCO, their inverse modulation sensitivity response characteristics are to some extent cancelled out. Thus the combined modulation sensitivity response of this arrangement is flatter than it would otherwise be, hence resulting in reduced tuning time and tuning range which in turn reduces the specification for the variable gain element in the high port signal path.

In an embodiment, one of the high port signal paths is coupled into a non-input node of the loop filter, and the other high port signal path is coupled to a varactor in order to vary its capacitance, and the varactor is in turn coupled to the tank circuit of the VCO. In this way the total capacitance of the tank circuit is modulated by the high port signal modulating its steering voltage input from the loop filter, and by modulating an external capacitance coupled to the tank circuit.

In one aspect the present invention provides a frequency modulator comprising: a phase lock loop circuit for receiving and modulating a carrier signal according to the low frequency component of a modulating signal, the phase lock loop circuit comprising a voltage controlled oscillator (VCO) for outputting a modulated carrier signal and a loop filter for outputting a steering voltage to the VCO, the VCO having a tank circuit comprising a voltage controlled capacitance, an external voltage controlled capacitance which is arranged to modulate its capacitance according to a high frequency component of the modulating signal, the external voltage controlled capacitance being coupled to the tank circuit; wherein the phase lock loop circuit is further arranged to modulate the steering voltage to the VCO with the high frequency component of the modulating signal.

In another aspect the present invention provides a method of modulating a carrier signal using a modulating signal in a phase lock loop circuit having a voltage controlled oscillator comprising a tank circuit which receives a steering voltage; the method comprising: modulating the output frequency of the phase lock loop circuit dependent on a low frequency component of the modulating signal; modulating the steering voltage dependent on a high frequency component of the modulating signal; and modulating the capacitance of an external voltage controlled capacitance coupled to the tank circuit depending on the high frequency component of the modulating signal.

BRIEF DESCRIPTION OF THE DRAWINGS

In order that the invention may be readily understood and put into practical effect, reference will now be made to an exemplary embodiment as illustrated with reference to the accompanying figures, where like reference numerals refer to identical or functionally similar elements throughout the separate views. The figures together with a detailed description below, are incorporated in and form part of the specification, and serve to further illustrate the embodiments and explain various principles and advantages, in accordance with the present invention where.

Figure 1A:
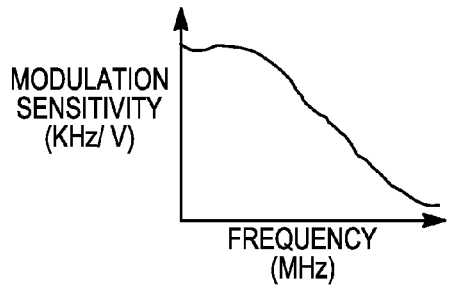
FIG. 1a is a graph of the modulation sensitivity response of a VCO having a high port signal coupled at a loop filter.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in combinations of method steps and apparatus components related to frequency modulation of a carrier frequency. Accordingly, the device components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a method or device that comprises a list of elements does not include only those elements but may include other elements not expressly listed or inherent to such method or device. An element proceeded by "comprises . . . a" does not, without more constraints, preclude the existence of additional identical elements in the process, method, article, or apparatus that comprises the element.

It will be appreciated that embodiments of the invention described herein may be comprised of one or more conventional processors and unique stored program instructions that control the one or more processors to implement, in conjunction with certain non-processor circuits, some, most, or all of the functions of frequency modulation of a carrier frequency described herein. The non-processor circuits may include, but are not limited to, a radio receiver, a radio transmitter, signal drivers, clock circuits, power source circuits, and user input devices. As such, these functions may be interpreted as steps of a method to perform frequency modulation of a carrier frequency. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

It will be appreciated that embodiments of the invention described herein may also be comprised of one or more software programs, embodied as processor control code, for example on a carrier medium such as a disk, CD- or DVD-ROM, programmed memory such as read only memory (Firmware), or on a data carrier such as an optical or electrical signal carrier, for example an Internet download. As the skilled person will appreciate, the code may be distributed between a plurality of coupled components in communication with one another.

Referring again to FIG. 1a and FIG. 1b, these show respectively the modulation sensitivity responses of a VCO in a dual port frequency modulator circuit when the high port signal is coupled to the (non-input node of the) loop filter or to an external varactor which is directly coupled to the tank circuit of the VCO. Both types of circuit modulate the total capacitance of the tank circuit with the high port signal, and hence the output frequency of the VCO. However they do so in different ways and one of the effects of this can be seen from the figures where the modulation sensitivity responses are different.

Figure 1B:
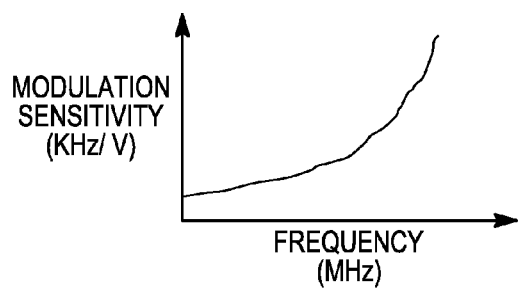
FIG. 1b is a graph of the modulation sensitivity response of a VCO having a high port signal coupled to control an external varactor coupled to the tank circuit of the VCO.

When the high port signal is coupled at the loop filter such that it modulates the driving voltage to the VCO tank circuit, the modulation sensitivity or the amount of frequency deviation per unit steering voltage change of the VCO drops with increasing output frequency as shown in FIG. 1a. By contrast, when the high port signal is used to vary the capacitance of a varactor coupled to the tank circuit, the output voltage of the VCO increases as the modulation sensitivity increases as shown in FIG. 1b.

Figure 2:
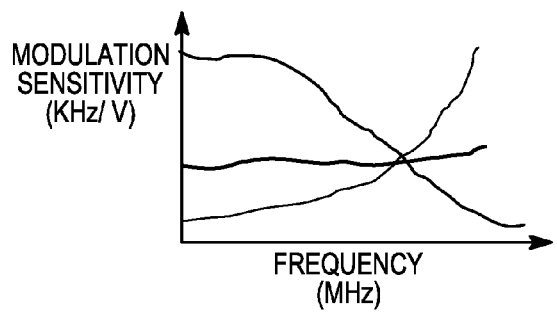
FIG. 2 is a graph of the modulation sensitivity response of a VCO having both a high port signal coupled at a loop filter and a high port signal coupled to control an external varactor coupled to the tank circuit of the VCO.

FIG. 2 shows the effect on the VCO modulation sensitivity response of coupling the high port signal both at the loop filter and at the external varactor coupled to the tank circuit. As can be seen, the inverse responses of FIG. 1a and FIG. 1b are cancelled out to some extent, such that the combined response is much flatter over the transmission frequencies of interest. Example simulation figures are given in table 1 below.

TABLE 1

| Mod Scheme | | F (MHz) | 403 | 410 | 420 | 430 | 440 | 450 | 460 | 470 |
|---|---|---|---|---|---|---|---|---|---|---|
| Loop | Dev (kHz) | | 6.32 | 6.2 | 6 | 5.74 | 5.34 | 4.8 | 4.12 | 3.23 |
| Filter | Dev (dB) | | 0 | −.16650 | −.45131 | −.83610 | −1.4635 | −2.3895 | −3.7163 | −5.8302 |
| Varactor | Dev (kHz) | | 0.72 | 1.05 | 1.5 | 1.78 | 2.33 | 3.04 | 3.67 | 4.2 |
| Mod | Dev (dB) | | 0 | 3.27713 | 6.37517 | 7.8617 | 10.2004 | 12.5108 | 14.1466 | 15.3184 |
| Loop filter + | Dev (kHz) | | 7.62 | 7.84 | 8.12 | 8.02 | 8.1 | 8.17 | 8.1 | 7.58 |
| varactor mod | Dev (dB) | | 0 | 0.24722 | 0.55202 | 0.44438 | 0.53060 | 0.60534 | 0.53060 | −0.0457 |

As can be seen, for loop filter only coupling of the high port signal, there is a modulation sensitivity variation of 2:1 from low end frequency to high end frequency. Using a varactor modulation scheme, there is a modulation sensitivity variation of 1:5.5 (depending on coupling point) from low end frequency to high end frequency. A two-high port modulation scheme according to the embodiment of FIG. 4 (described in detail below) flattens the modulation response to less than 1 dB deviation across the transmission frequencies.

Figure 3:
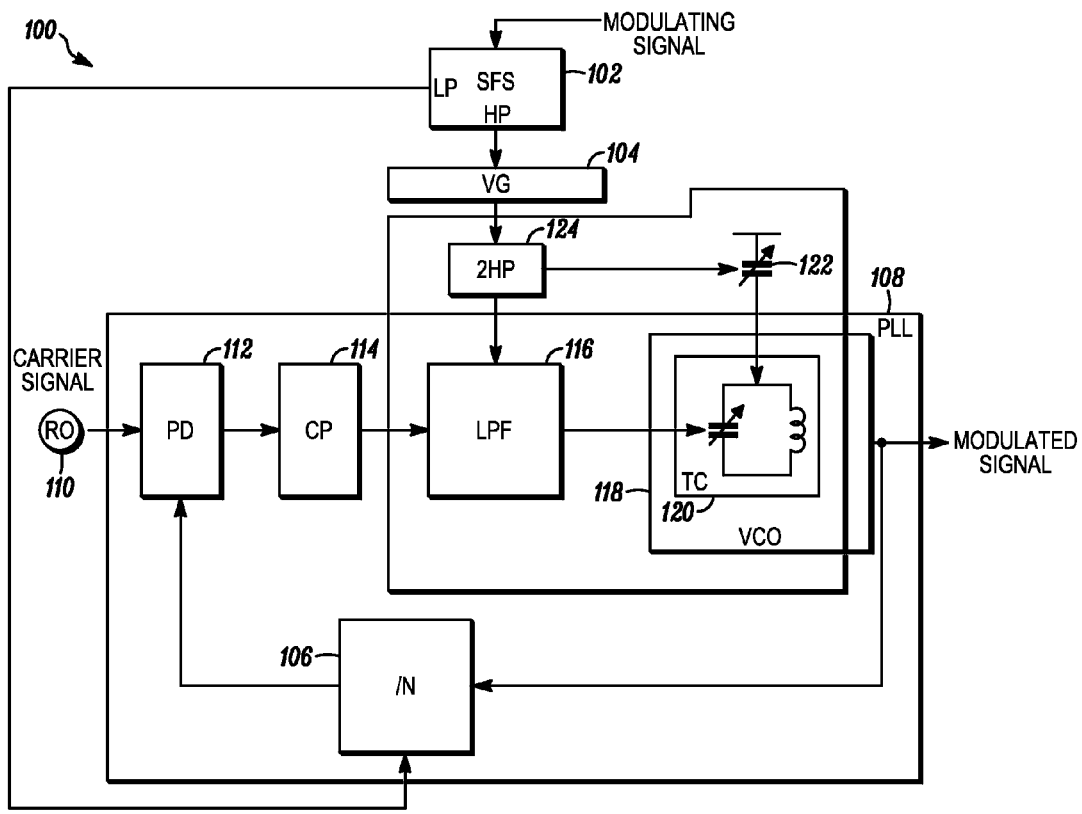
FIG. 3 is a schematic block circuit diagram illustrating circuitry of a frequency modulator device according to an embodiment.

FIG. 3 shows a block diagram of a circuit arrangement for introducing two high port signals into a phase lock loop (PLL) circuit 108 of a frequency modulator and which receives and modulates a carrier signal from a reference frequency source 110. The phase lock loop circuit 108 comprises a phase detector 112, a charge pump 114, a loop filter 116, a voltage controlled oscillator (VCO) 118, and a controllable fractional divider 106. The VCO 118 receives a steering voltage input from the loop filter 116, and comprises a tank circuit 120 having one or more inductors and capacitors, at least some of which are variable dependent on the steering voltage applied to the input of the VCO 118. Typically one or more voltage controlled capacitance or varactor devices are used, which vary their capacitance dependent on the voltage applied across them. Thus as the steering voltage input changes, the total capacitance of the tank circuit 120 changes and hence the resonant or output frequency of the VCO 118. This VCO output is the modulated carrier signal.

The circuit block also comprises a modulating frequency splitter 102 typically implemented in or controlled by a digital signal processor (DSP) to split the modulating signal into high (HP) and low (LP) frequency components, a variable gain circuit 104 coupled to the high port, and a two-high port signal modulation circuit 124 coupled to the variable gain circuit 104. The two high port modulation circuit 124 is coupled to the loop filter 116 and to an external voltage controlled capacitance 122 which is coupled into the tank circuit 120.

The PLL 108 is arranged such that the low port signal or low frequency component of the modulating signal modulates the carrier signal. In the embodiment this is achieved by controlling a variable frequency divider 106 within the PLL feedback loop. The variable frequency divider 106 is typically implemented with a prescaler and an accumulator to realise a fractional division ratio dependent on the low port signal as would be known to those skilled in the art. For example the low port signal modulates the divider digitally, and in addition the low port signal sample is mapped into the accumulator input bits so that it is summed with the frequency word from the divider.

Therefore changes in the low port signal change the fractional division ratio of the divider 106, and this results in a phase difference between the feedback signal from the divider 106, and the carrier frequency from the reference frequency source 110. This phase difference is detected at the phase detector 112, which charges the charge pump 114 up or down depending on whether the feedback frequency is less than or more than the reference frequency. The corresponding voltage signal output from the charge pump 114 is low pass filtered by the loop filter 116 in order to generate the VCO steering voltage.

The high port signal or high frequency component of the modulating signal is split from the low port component at the frequency splitter 102, and is from there amplified or attenuated by a variable gain circuit 104. The high port signal path also includes a two-high port modulation circuit 124 which provides two high port signals. These two high port signals may be attenuated or further processed in other ways depending on implementation. One of the high port signals is applied to a non-input node of the loop filter 116. This may include the output node of the loop filter 116 such that the high port signal is effectively applied directly to the VCO input or steering voltage signal. In other embodiments, the high port signal may be partially filtered by the loop filter 116, by connecting the high port signal path to a node between the input and output nodes of the loop filter 116.

The other high port signal is applied to an external voltage controlled capacitance 122 in order to modulate its capacitance according to the high frequency component of the modulating signal. Typically this external voltage controlled capacitance is implemented using an external varactor whose capacitance varies with the voltage applied across it. The external varactor 122 is coupled to the tank circuit 120, such that the total capacitance of the tank circuit 120 is modulated by the variation in capacitance in the external varactor 122. Thus the high frequency component of the modulating signal modulates the resonant frequency of the tank circuit both via modulation of the capacitance of the external varactor 122 and via modulation of the steering voltage of the VCO 118.

Figure 4:
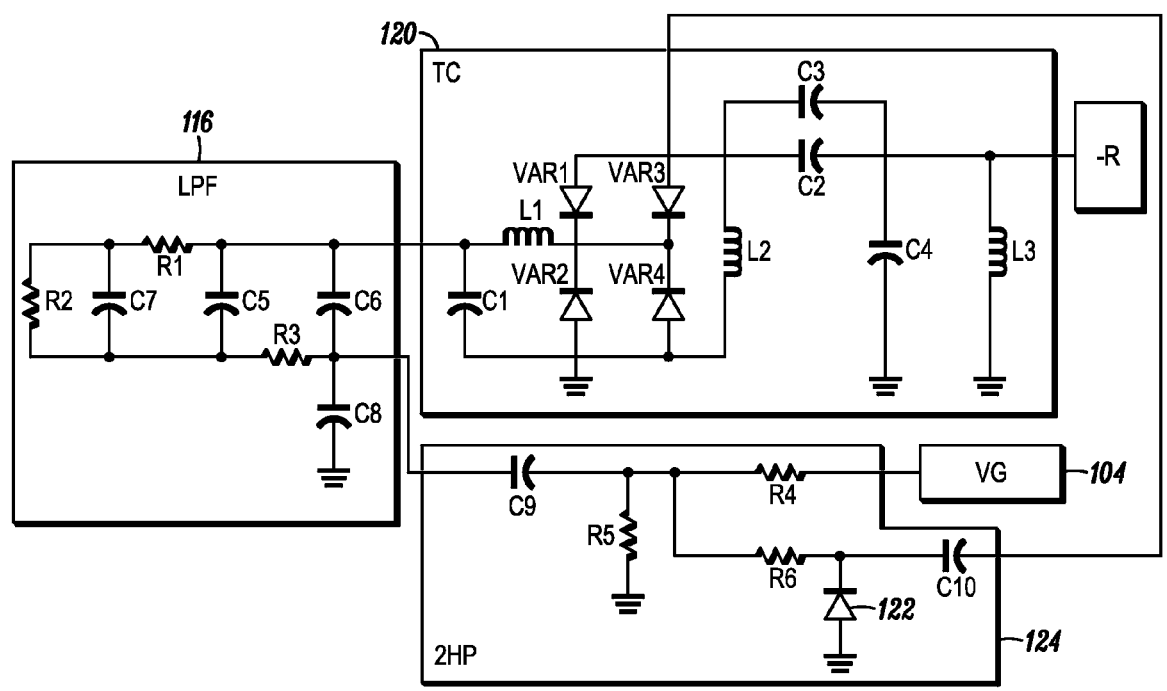
FIG. 4 is a circuit diagram illustrating the loop filter, tank circuit, and two-high port modulation circuitry of the frequency modulator device of FIG. 3.

FIG. 4 shows a circuit diagram of the loop filter 116, tank circuit 120 and two high port modulation circuit 124 of FIG. 3. The loop filter comprises a number of resistors R1, R2, and R3 and a number of capacitors C5, C6, C7, and C8. These are arranged into a low pass filter for filtering the input from the charge pump. The output from node C5-C6-R1 is the steering voltage provided to the tank circuit 120.

The tank circuit 120 comprises a number of varactors VAR1, VAR2, VAR3, and VAR4, a number of fixed capacitors C1, C2, C3, and C4, and a number of inductors L1, L2, and L3. The exact arrangement of these circuit components and their values will depend on design requirements as known by those skilled in the art. The capacitance of the varactors VAR1-VAR4 varies with the input steering voltage from the loop filter 116, and thus the resonant frequency of the tank circuit is modulated by this steering voltage. A negative resistance (−R) is shown which forms part of the rest of the VCO 118.

The two high port modulation circuit 124 receives an input from the variable gain circuit 104 in the high port signal path, and has two outputs, one to the loop filter 116, and one to the tank circuit 120. The two high port modulation circuit 124 also comprises an external varactor 122, resistors R4, R5, and R6, and fixed capacitors C9 and C10. Resistor R5 is a voltage divider which reduces the voltage swing of the split high port signals going to the loop filter 116 and the tank circuit in order to reduce their modulation effects on the steering voltage and tank circuit capacitance. This is introduced because the tank circuit is now subject to two high port signal influences rather than one, and so the "influence" of each of the two high port signals in this embodiment needs to be effectively halved. Capacitor C9 is a coupling capacitor which couples the divided high port signal to the loop filter at the node between the main filter capacitor C8 and capacitor C6. Coupling to this non-output node of the loop filter 116, reduces noise entering the tank circuit, or any unwanted frequency shaping due to the loop filter impedance. The high port signal may alternatively be coupled closer to the input node of the loop filter 116 in order to partially filter this high port signal.

Resistor R6 is an RF block which blocks radio frequency (RF) signals entering the tank circuit via the external varactor coupling. The high port signal varies the capacitance value of the external varactor 122, which is coupled via coupling capacitor C10 into the tank circuit 120. Again various alterations to the detailed circuitry of the two high port modulation circuit 124 and/or the tank circuit 120 could be made without departing from the inventive concept.

The modulation sensitivity response of a two-high port frequency modulator manufactured according to an embodiment will be flatter than those having conventional single port couplings to the loop filter or an external varactor. This means the tuning time per unit following manufacture is reduced, thereby reducing the per unit cost of the modulator. Furthermore, as the response is flatter, the tuning range required is reduced. This means that the range or size of the variable gain circuit 104 can also be reduced compared with those of conventional circuit arrangements, which allows for a further reduction in per unit cost of modulators according to an embodiment.

The embodiment is well suited to wide band applications such as UHF devices like walkie-talkies or two-way radios which transmit over a number of channels. Such devices are particularly sensitive to the non-linear modulation sensitivity experienced with dual-port direct frequency modulators as they require operation over a wide transmission frequency range.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims.

We claim:

1. A frequency modulator comprising:
a low frequency component of the modulating signal, voltage controlled oscillator (VCO) for outputting a modulated carrier signal and a loop filter for outputting a steering voltage to the VCO, the VCO having a tank circuit comprising a voltage controlled capacitance, the phase lock loop circuit comprises a variable frequency divider coupled to the output of the VCO and which is arranged to vary its division ratio according to the low frequency component of the modulating signal;
an external voltage controlled capacitance which is arranged to modulate its capacitance according to a high frequency component of the modulating signal, the external voltage controlled capacitance being coupled to the tank circuit;
a voltage divider coupled between a non-input node of the loop filter and an input port for the high frequency component of the modulating signal; and
a RF blocking device coupled between the external voltage controlled capacitance and the input port for the high frequency component of the modulating signal,
wherein the phase lock loop circuit is further arranged to modulate the steering voltage to the VCO with the high frequency component of the modulating signal.

2. A frequency modulator as claimed in claim 1 wherein the loop filter is arranged to receive the high frequency component of the modulating signal at a non-input node of the loop filter.

3. A frequency modulator as claimed in claim 1 further comprising a variable gain circuit which is coupled between the input port for the high frequency component of the modulating signal and the non-input node of the loop filter and the external voltage controlled capacitance, the variable gain circuit being arranged to vary the modulation sensitivity response of the VCO with the gain of the high frequency component of the modulation signal.

* * * * *